(12) United States Patent
Matsuzawa et al.

(10) Patent No.: US 12,249,556 B2
(45) Date of Patent: Mar. 11, 2025

(54) COOLER AND SEMICONDUCTOR APPARATUS

(71) Applicant: FUJI ELECTRIC CO., LTD., Kawasaki (JP)

(72) Inventors: Kensuke Matsuzawa, Kawasaki (JP); Takahiro Koyama, Kawasaki (JP); Hiromichi Gohara, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 580 days.

(21) Appl. No.: 17/514,810

(22) Filed: Oct. 29, 2021

(65) Prior Publication Data
US 2022/0173013 A1 Jun. 2, 2022

(30) Foreign Application Priority Data

Dec. 1, 2020 (JP) ................................. 2020-199467

(51) Int. Cl.
*H01L 23/473* (2006.01)
*H01L 23/367* (2006.01)

(52) U.S. Cl.
CPC ........ *H01L 23/473* (2013.01); *H01L 23/3675* (2013.01)

(58) Field of Classification Search
CPC . H01L 23/473; H01L 23/3675; H01L 23/053; H01L 23/24; H01L 23/3677; H01L 23/3735; H01L 23/4334; H01L 24/29; H01L 24/32; H01L 2224/291; H01L 2224/32225; H01L 2924/10254;
(Continued)

(56) References Cited

U.S. PATENT DOCUMENTS

2009/0162686 A1* 6/2009 Matsukado ............. C22C 21/00
428/576
2012/0279761 A1* 11/2012 Hori .................... H01L 23/3735
228/122.1
(Continued)

FOREIGN PATENT DOCUMENTS

JP H0970658 A 3/1997
JP 2009293888 A 12/2009
(Continued)

OTHER PUBLICATIONS

Japanese Office Action dated Oct. 1, 2024, in the counterpart Japanese Patent Application No. 2020-199467.

*Primary Examiner* — Jonathan Han
(74) *Attorney, Agent, or Firm* — Rabin & Berdo, P.C.

(57) ABSTRACT

A cooler includes a top plate, one surface of which serves as a heat dissipation surface, a bottom plate disposed so as to face the top plate and having a larger thickness than that of the top plate, a plurality of fins provided between the top plate and the bottom plate, and a circumferential wall part provided so as to surround the plurality of fins along outer circumferential edges of the bottom plate. The plurality of fins and the outer circumferential wall part are provided between the top plate and the bottom plate and bonded to the heat dissipation surface of the top plate. A flow path for a coolant is formed by a space enclosed by the top plate, the bottom plate, the plurality of fins, and the circumferential wall part. The top plate has an electric potential higher than that of the bottom plate.

16 Claims, 7 Drawing Sheets

(58) Field of Classification Search
CPC ... H01L 2924/10272; H01L 2924/1033; H01L 2924/1203; H01L 2924/13055; H01L 2924/13091; H01L 23/3672
See application file for complete search history.

(56) References Cited

U.S. PATENT DOCUMENTS

| | | | |
|---|---|---|---|
| 2013/0264702 A1* | 10/2013 | Nishi | H01L 23/3735 |
| | | | 257/712 |
| 2014/0158330 A1 | 6/2014 | Kuroda et al. | |
| 2014/0158335 A1* | 6/2014 | Kuroda | F28F 21/089 |
| | | | 148/528 |
| 2015/0021756 A1* | 1/2015 | Adachi | H05K 7/20927 |
| | | | 257/714 |
| 2017/0271240 A1* | 9/2017 | Inoue | H01L 23/473 |

FOREIGN PATENT DOCUMENTS

| | | |
|---|---|---|
| JP | 2013036097 A | 2/2013 |
| JP | 2013036098 A | 2/2013 |
| JP | 2014107516 A | 6/2014 |
| JP | 2017005181 A | 1/2017 |

\* cited by examiner

COOLER AND SEMICONDUCTOR APPARATUS

CROSS REFERENCE TO RELATED APPLICATIONS

This application is based upon and claims the benefit of priority of the prior Japanese Patent Application No. 2020-199467, filed on Dec. 1, 2020, the entire contents of which are incorporated herein by reference.

BACKGROUND OF THE INVENTION

Field of the Invention

The present invention relates to a cooler and a semiconductor apparatus.

Description of the Related Art

A general-purpose heat exchanger (cooler) is formed of a metallic material having good heat conductivity such as an aluminum alloy (see Japanese Patent Laid-Open No. 9-070658 and 2009-293888). For example, Japanese Patent Laid-Open No. 9-070658 discloses a method for manufacturing a so-called finned tube heat exchanger. According to Japanese Patent Laid-Open No. 9-070658, an extruded flat tube made of an aluminum alloy and fins are bonded with a brazing material. Also, according to Japanese Patent Laid-Open No. 2009-293888, a corrugated plate is placed between a pair of plate members, and the plate members and the corrugated plate are bonded with a brazing material.

Also, cooling targets of a cooler include a semiconductor apparatus. A semiconductor apparatus has a substrate having thereon semiconductor elements such as an insulated gate bipolar transistor (IGBT), a power metal oxide semiconductor field effect transistor (MOSFET) and a free wheeling diode (FWD) and is utilized in, for example, an inverter apparatus.

In this type of semiconductor apparatus, one in which a cooler is integrated has been proposed (see Japanese Patent Laid-Open Nos. 2013-036098 and 2017-005181, for example). Semiconductor elements are disposed on a predetermined circuit substrate (which may be called an insulating substrate) and is mounted on a cooler with a bonding material such as solder. For example, the cooler includes a top plate on which semiconductor elements and so on are mounted, heat dissipation fins, a bottom plate, an inlet portion and an outlet portion for a coolant and so on. The top plate, heat dissipation fins and bottom plate are bonded with, for example, a brazing material.

By the way, a coolant (cooling water) flows in an internal part of the cooler. Because a coolant flows, corrosion may occur on an inner surface of the cooler. The cooler has holes with the advance of corrosion, and there is a risk that the coolant leaks to outside.

An object of the present invention, which has been made in view of such a point, is to provide a cooler and a semiconductor apparatus by which local corrosion at a predetermined part on a coolant path can be suppressed.

SUMMARY OF THE INVENTION

A cooler according to one aspect of the present invention includes a top plate, one surface of which serves as a heat dissipation surface, a bottom plate disposed so as to face the top plate and having a larger thickness than that of the top plate, a plurality of fins provided on the bottom plate, and a circumferential wall part provided so as to surround an outer circumference of the plurality of fins along outer circumferential edges of the bottom plate. The plurality of fins and the outer circumferential wall part are bonded to the heat dissipation surface of the top plate, and a flow path for a coolant is formed by a space enclosed by the top plate, the bottom plate, the plurality of fins, and the circumferential wall part, and a side of the top plate (top plate side) has a higher electric potential than an electric potential of a side of the bottom plate (bottom plate side).

A semiconductor apparatus according to another aspect of the present invention includes the aforementioned cooler, and a semiconductor element disposed on another surface of the top plate through an insulating substrate. The plurality of fins are disposed immediately under the semiconductor element.

According to the present invention, local corrosion at a predetermined part on a coolant path can be suppressed.

DETAILED DESCRIPTION OF THE PREFERRED EMBODIMENT

Figure 1:
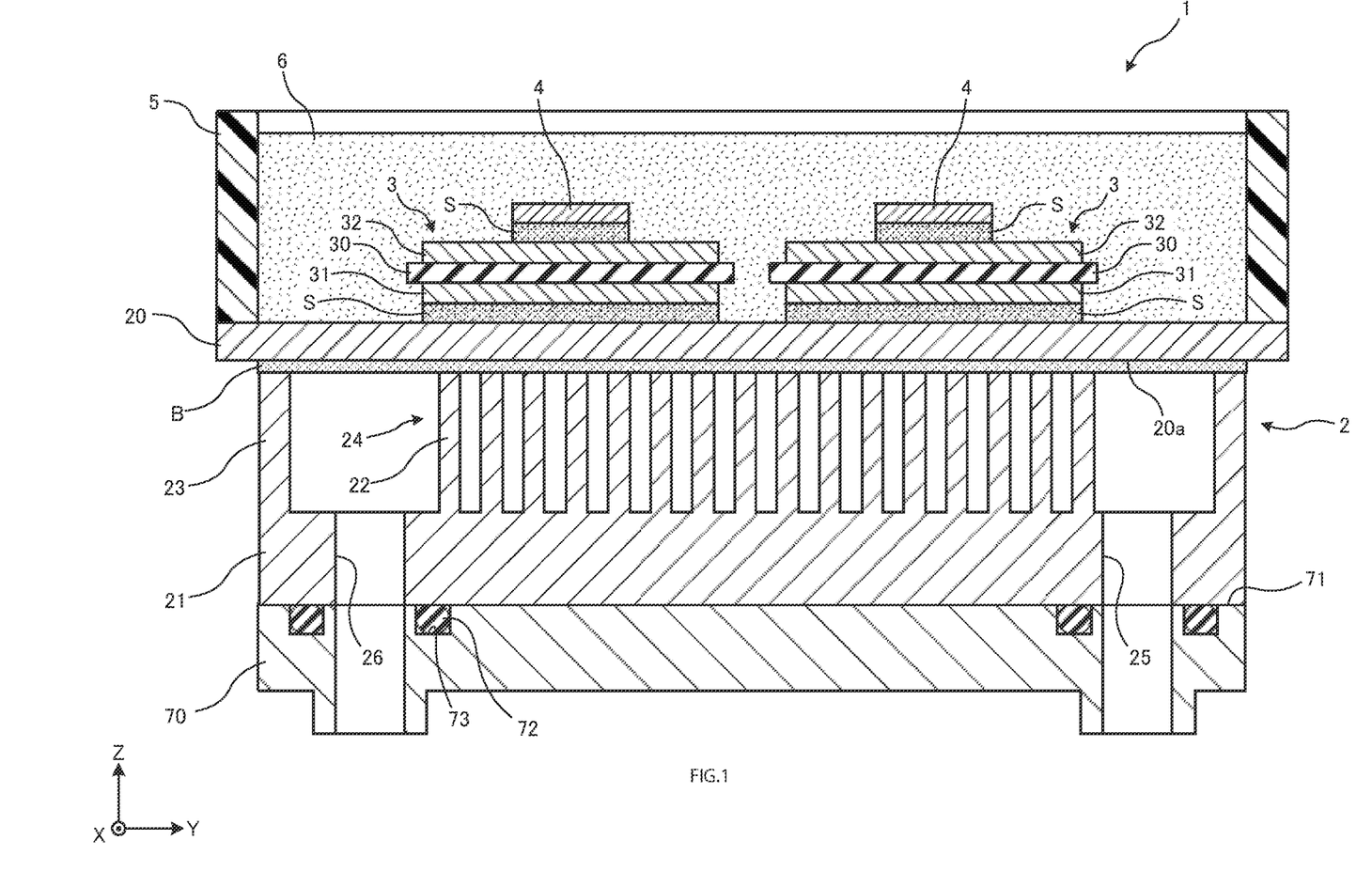
FIG. 1 is a cross-sectional view of a semiconductor apparatus according to an embodiment.
Figure 2:
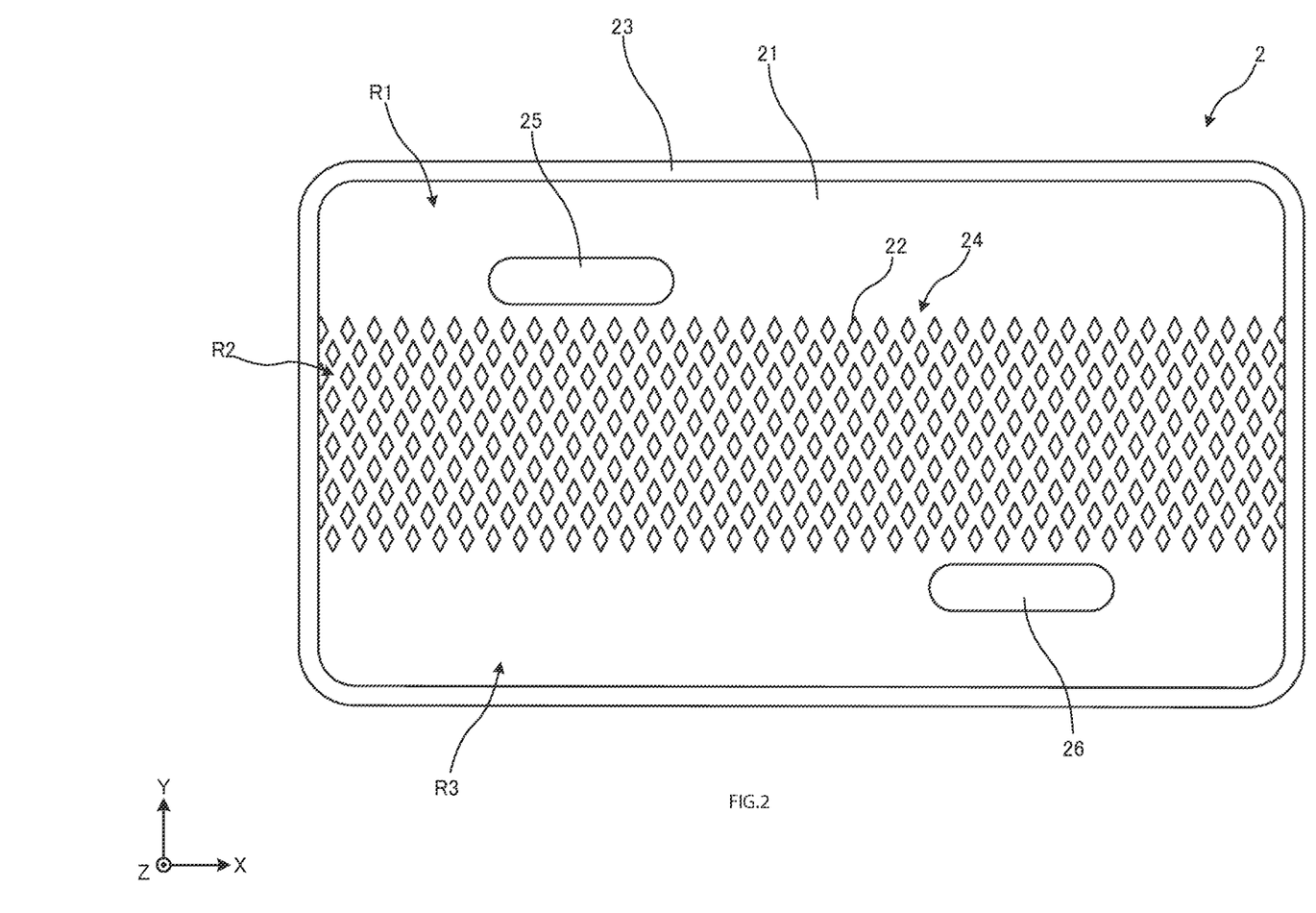
FIG. 2 is a plan view of a cooler according to the embodiment from which a top plate thereof is omitted and which is viewed from its upper surface side.

A semiconductor apparatus to which the present invention is applicable is described below. FIG. 1 is a cross-sectional view of a semiconductor apparatus according to an embodiment. FIG. 2 is a plan view of a cooler according to the embodiment from which a top plate thereof is omitted and which is viewed from its upper surface side. The semiconductor apparatus to be described later is merely an example, and changes can be made as required without limiting thereto.

In the following drawings, a longitudinal direction of the semiconductor apparatus (cooler) (or a direction in which a plurality of phases are aligned), a transverse direction of the semiconductor apparatus (cooler) and a height direction (direction of thickness of a substrate) are defined as an X direction, a Y direction and a Z direction, respectively. The shown axes of X, Y, Z are orthogonal to each other and form a right-handed system. In some cases, the X direction, the Y direction and the Z direction may be called a right-left direction, a front-back direction and a top-bottom direction, respectively. These directions (front-back, right-left, and top-bottom directions) are words used for convenience of description, and the correspondence relationships with the X, Y, Z directions may change depending on the attached attitude of the semiconductor apparatus. For example, a heat dissipation surface side (cooler side) of the semiconductor apparatus is called a lower surface side, and the opposite side is called an upper surface side. The planar view herein refers to a view in the Z direction of the upper surface or the lower surface of the semiconductor apparatus.

A semiconductor apparatus 1 according to the embodiment is applied to a power converter such as a power control unit and is a power semiconductor module included in an inverter circuit. As shown in FIGS. 1 and 2, the semiconductor apparatus 1 includes a plurality of insulating substrates 3 on an upper surface of a top plate 20 and a semiconductor element 4 on an upper surface of each of the insulating substrates 3. The plurality of insulating substrates 3 and semiconductor elements 4 are surrounded by a frame-shaped case member 5. A sealing resin 6 is filled in an inner space of the case member 5.

Although two insulating substrates 3 and two semiconductor elements 4 are disposed side by side in the Y direction in FIG. 1, the present invention is not limited to the configuration. For example, a plurality of insulating substrates 3 and semiconductor elements 4 may be disposed side by side not only in the Y direction but also in the X direction. In this case, the plurality of insulating substrates 3 and semiconductor elements 4 construct an inverter circuit.

The top plate 20 configures a part of a cooler 2 and is composed of a plate-shaped body being rectangular in planar view and having a predetermined thickness. The cooler 2 includes, for example, the top plate 20, a bottom plate 21, a plurality of fins 22 provided on the bottom plate 21, and a circumferential wall part 23. The configuration of the cooler 2 is described later.

A lower surface that is one surface of the top plate 20 serves as a heat dissipation surface 20a. The heat dissipation surface 20a is a surface that dissipates heat of the semiconductor elements, and distal ends of the plurality of fins 22, which are described later, are bonded to the heat dissipation surface 20a. The heat dissipation surface 20a is also a surface with which a coolant is in direct contact.

The insulating substrates 3 are disposed on an upper surface that is the other surface of the top plate 20 with solder S. The solder S can also be replaced by other bonding agents such as a sintered material. The insulating substrates 3 are composed of, for example, a direct copper bonding (DCB) substrate, an active metal brazing (AMB) substrate or a metallic base substrate. More specifically, the insulating substrates 3 have an insulating plate 30, a heat dissipation plate 31 disposed on a lower surface of the insulating plate 30, and a circuit plate 32 disposed on an upper surface of the insulating plate 30. The insulating substrates 3 have, for example, a rectangular shape in planar view.

The insulating plate 30 is formed by, for example, an insulating material such as a ceramics material such as alumina ($Al_2O_3$), aluminum nitride (AlN) or silicon nitride ($Si_3N_4$), a resin material such as epoxy, or an epoxy resin material having a ceramics material as a filler. It should be noted that the insulating plate 30 may be called an insulating layer or an insulating film.

The heat dissipation plate 31 has a predetermined thickness in the Z direction and is formed so as to cover all over the lower surface of the insulating plate 30. The heat dissipation plate 31 is formed by a metallic plate having good heat conductivity of, for example, copper or aluminum.

The circuit plate 32 is provided on the upper surface of the insulating plate 30. It should be noted that, although FIG. 1 shows only one circuit plate 32 for one insulating plate 30 for convenience of description, more circuit plates 32 may be formed on the upper surface of the insulating plate 30.

These circuit plates 32 are metallic layers made of, for example, a copper foil and having a predetermined thickness and are formed in island shapes on the insulating plate 30 such that the circuit plates 32 are electrically insulated from each other.

The semiconductor element 4 is disposed on the upper surface of the circuit plate 32 with the solder S. The solder S can also be replaced by other bonding agents such as a sintered material. The semiconductor element 4 is, for example, square-shaped in planar view. The semiconductor element 4 is disposed at a position corresponding to the plurality of fins 22, details of which are described below.

The semiconductor element 4 is disposed on the upper surface of the circuit plate 32 with the solder S and is electrically connected thereto. Although FIG. 1 shows one semiconductor element 4 for one circuit plate 32 for convenience, more semiconductor elements 4 may be disposed on the circuit plate 32. The semiconductor element 4 is square-shaped (rectangular-shaped) in planar view and is formed by a semiconductor substrate of, for example, silicon carbide (SiC), gallium nitride (GaN) or diamond.

As the semiconductor element 4, an insulated gate bipolar transistor (IGBT), a switching element such as a power metal oxide semiconductor field effect transistor (MOSFET), or a diode such as a free wheeling diode (FWD) is used. Alternatively, as the semiconductor element 4, a reverse conducting (RC)—IGBT element in which an IGBT and an FWD are integrated, a power MOSFET element, a reverse blocking (RB)—IGBT having a sufficient resistance to pressure against a reverse bias or the like may be used.

The shape, number of positions or positions of the semiconductor elements 4 can be changed as required. Although the semiconductor element 4 according to this embodiment is a vertical switching element having a function element such as a transistor on the semiconductor substrate, the semiconductor element 4 is not limited thereto and may be a horizontal switching element.

The case member 5 is bonded to the upper surface of the top plate 20 with, for example, an adhesive (not shown). The case member 5 has a shape following an external shape of the top plate 20. Also, the case member 5 has a rectangular frame shape that is open at its center. The aforementioned insulating substrates 3 and the semiconductor elements 4 are accommodated in the central opening. In other words, the insulating substrates 3 and the semiconductor elements 4 are surrounded by the frame-shaped case member 5.

The sealing resin 6 is filled in an inner space of the case member 5, details of which are described later. In other words, the case member 5 defines a space that accommodates the plurality of insulating substrates 3 and semiconductor elements 4 and the sealing resin 6. This case member 5 is formed of, for example, a thermoplastic resin. The case member 5 is formed of, for example, a polyphenylene sulfide resin (PPS resin), a polybutylene terephthalate resin (PBT resin) or the like.

Main terminals (a P terminal, an N terminal, an M terminal, and so on) for external connection and a control terminal for control, not shown, are provided in the case member 5. These terminals are, for example, integrated with the case member 5.

As described above, the sealing resin 6 is filled within a space provided by the frame-shaped case member 5. Thus, the insulating substrates 3 and the semiconductor elements 4 mounted thereon are sealed within the space. The sealing resin 6 is formed of, for example, a thermosetting resin. Specifically, the sealing resin 6 preferably contains at least one of epoxy, silicone, urethane, polyimide, polyamide, and polyamide-imide. As the sealing resin 6, for example, an epoxy resin to which a filler is mixed is preferable from viewpoint of its insulation property, heat resistance property and heat dissipation property.

Next, a detailed configuration of the cooler 2 is described. As shown in FIGS. 1 and 2, the cooler 2 has a box shape formed by bonding the top plate 20 and the bottom plate 21 and integrating them. The cooler 2 is formed of, for example, an aluminum alloy having a good heat dissipation property.

As described above, the top plate 20 is rectangular-shaped in planar view and is formed by a plate-shaped body having a predetermined thickness. The top plate 20 has an external shape corresponding to the external shape of the case member 5. In other words, the top plate 20 has a longitudinal direction extending in the right-left direction (X direction) of the semiconductor apparatus 1 and a transverse direction extending in the front-back direction (Y direction) of the semiconductor apparatus 1. The top plate 20 has one surface (lower surface) and the other surface (upper surface). The one surface forms a heat dissipation surface that dissipates heat of the semiconductor elements 4. The other surface forms a bonding surface to the insulating substrates 3.

According to this embodiment, the plurality of insulating substrates 3 and semiconductor elements 4 are disposed in a central area of the upper surface of the top plate 20. For example, the plurality of insulating substrates 3 and semiconductor elements 4 are disposed side by side in the X direction or the Y direction. Although two insulating substrates 3 and two semiconductor elements 4 are disposed side by side in the Y direction in FIG. 1, the present invention is not limited to this configuration. The insulating substrates 3 and the semiconductor elements 4 may be disposed side by side in the X direction. It should be noted that, according to this embodiment, the central area of the lower surface side (heat dissipation surface side) of the top plate 20 on which the plurality of insulating substrates 3 and semiconductor elements 4 described above are disposed is sometimes called a heat dissipation area.

The bottom plate 21 has a rectangular shape in planar view, which is the same shape as that of the top plate 20, and is disposed immediately under the top plate 20 so as to face the top plate 20 with a predetermined space in between. The bottom plate 21 is formed by a plate-shaped body having a larger thickness than that of the top plate 20. The bottom plate 21 is preferably formed of an aluminum alloy that is the same material as that of the top plate 20.

The plurality of fins 22 are provided on the upper surface of the bottom plate 21. As the fins 22, prism-shaped pin fins that extend in, for example, the Z direction can be used. The plurality of fins 22 may be arranged with a predetermined pitch in between in the X direction, the Y direction or a direction intersecting the XY direction. The plurality of fins 22 may be formed of the same metallic material as the bottom plate 21 and may be provided integrally with the bottom plate 21. In other words, the fins 22 are used as a heat sink.

More specifically, each of the fins 22 has a rhombus shape in planar view, and the facing direction where a pair of corners face each other on a diagonal line agrees with the X direction or the Y direction. Also, the fins 22 project by a predetermined length toward the Z-direction positive side. One end of each of the fins 22 is connected to the upper surface of the bottom plate 21, and the other end is connected to the lower surface (heat dissipation surface) of the top plate 20. Also, the fins 22 may be connected to the top plate 20 or the bottom plate 21 with a bonding material B, which is described later. It should be noted that the configuration of the fins 22 provided on the bottom plate 21 is not limited thereto but can be changed as required. For example, a plurality of cylindrical-shaped pins may be provided, or a plurality of fins 22 having a blade shape extending in the front-back direction or the right-left direction may be aligned in parallel with each other. The fins 22 may be provided to the bottom plate 21 by brazing, implanting, cutting processing or plastic working.

The plurality of fins 22 form a fin collection 24 having a substantially rectangular parallelepiped shape as a whole. The longitudinal direction of the fin collection 24 agrees with the longitudinal direction of the bottom plate 21. It should be noted that the external shape of the fin collection 24 is not limited thereto but may be rounded or deformed.

The upper surface of the bottom plate 21 has the circumferential wall part 23 that surrounds an outer circumference of the plurality of fins 22 (fin collection 24). The circumferential wall part 23 projects by a predetermined height from the upper surface of the bottom plate 21 toward the Z-direction positive side. Also, the circumferential wall part 23 has a rectangular frame shape along the circumferential outer edges of the bottom plate 21. It should be noted that the projection height of the circumferential wall part 23 is preferably equal to the projection height of the fins 22.

The bottom plate 21 and the circumferential wall part 23 may be integrated with each other. In other words, the bottom plate 21 and the circumferential wall part 23 form a box-shaped cooler case that is open upward. The top plate 20 forms a lid part that closes the opening of the cooler case.

The top plate 20 is bonded to distal ends (upper ends) of the circumferential wall part 23 and the plurality of fins 22 described above by, for example, brazing. Thus, the upper opening of the cooler case is closed. In this way, a flow path for a coolant is formed by a space enclosed by the top plate 20, the bottom plate 21, the plurality of fins 22, and the circumferential wall part 23. For example, cooling water is used as the coolant, and its property can be changed as required. Also, the bonding configuration of the top plate 20 and the cooler case is described later.

The space enclosed by the top plate 20, the bottom plate 21 and the circumferential wall part 23 is divided into three spaces (a first header part R1, a fin accommodating part R2 and a second header part R3). More specifically, the first header part R1 forms a space leading to an inlet portion 25 for a coolant, which is described later. The fin accommodating part R2 forms a space in which the plurality of fins 22 described above are accommodated. The second header part R3 forms a space leading to a discharge portion 26 for the coolant, which is described later.

The first header part R1 and the second header part R3 are disposed so as to face each other with the fin accommodating part R2 interposed therebetween in the Y direction. In other words, the first header part R1 forms a coolant flow path on an upstream side of the fin accommodating part R2, and the second header part R3 forms a coolant flow path on a downstream side of the fin accommodating part R2. Liquid is used as the coolant. Various kinds of liquid can be used as the coolant.

As shown in FIG. 2, the inlet portion 25 and the discharge portion 26 for the coolant to and from the cooler 2 are provided at predetermined positions of the bottom plate 21. Each of the inlet portion 25 and the discharge portion 26 has a through-hole extending through the bottom plate 21 in the thickness direction. More specifically, the inlet portion 25 and the discharge portion 26 are disposed so as to face each other diagonally with the plurality of fins 22 interposed therebetween in the Y direction. For example, in the first header part R1, the inlet portion 25 is disposed closer to the X direction negative side. On the other hand, in the second header part R3, the discharge portion 26 is disposed closer to the X direction positive side.

Also, each of the inlet portion 25 and the discharge portion 26 has a long-hole shape that is long in the X direction in planar view. For example, the shape of the inlet portion 25 and the discharge portion 26 is an elliptical shape that is short on the transverse direction side of the cooler 2 and is long on the longitudinal direction side. It should be noted that the shapes and positions of the inlet portion 25 and the discharge portion 26 are not limited thereto but can be changed as required.

The semiconductor apparatus 1 having the configuration as described above is attached to a flat attachment surface 71 of a flange 70 having a connection portion for a hose, not shown, with a gasket such as an O-ring 72 interposed therebetween. In this case, the lower surface of the bottom plate 21 is in contact with the attachment surface 71. Referring to FIG. 1, for example, the flange 70 has a groove 73 for the O-ring 72. Because of the O-ring 72, the sealing between the attachment surface 71 and the lower surface of the bottom plate 21 is acquired.

Figure 3:
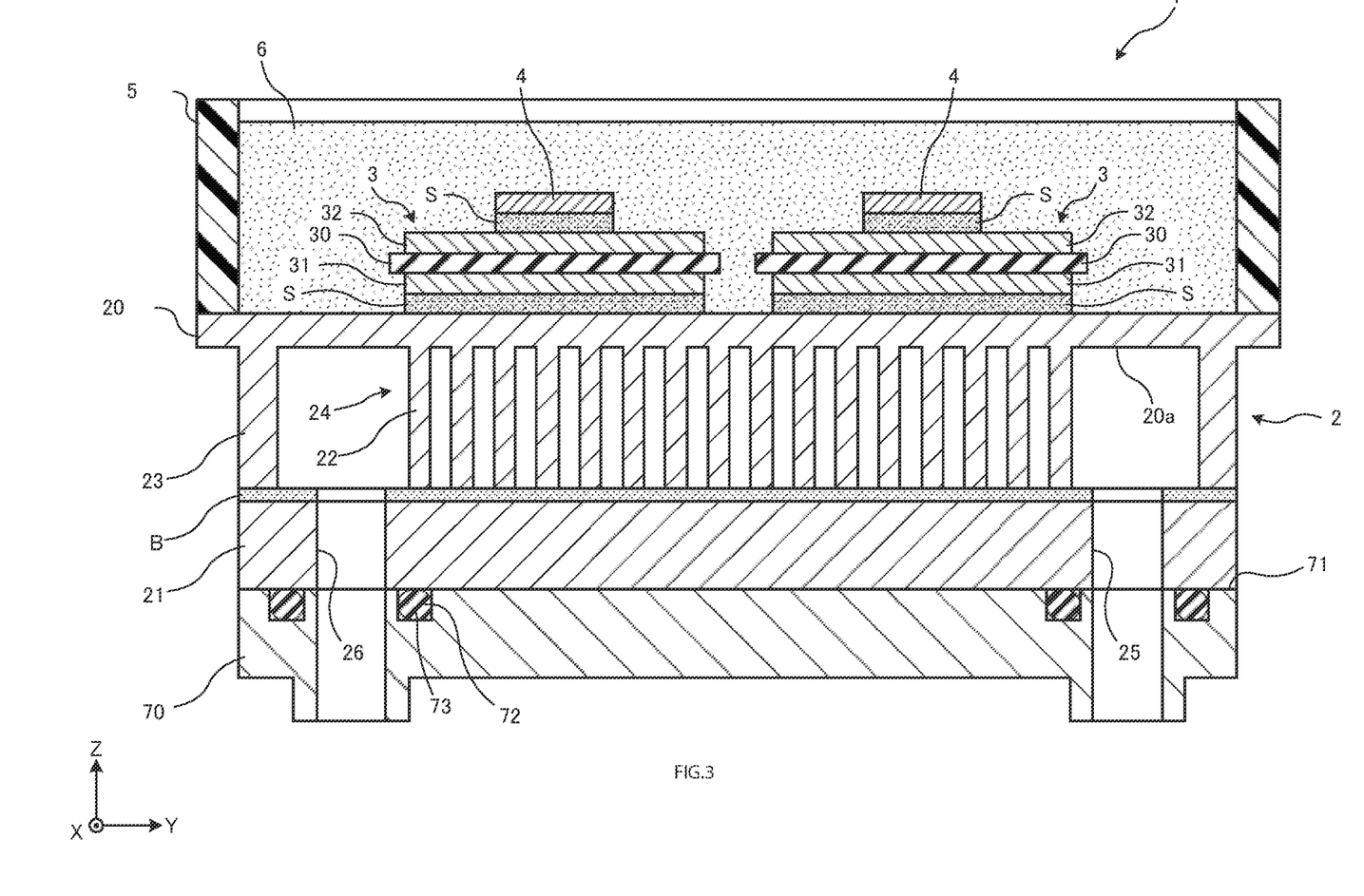
FIG. 3 is a cross-sectional view of a semiconductor apparatus according to a comparative example.

By the way, in a water-cooled cooler, a coolant flows within a space (flow path for the coolant) formed inside of the cooler. As the coolant, for example, various kinds of cooling water are used. For that, it is assumed that the coolant in contact with an inner surface of the cooler over a long time causes corrosion. The cooler according to this embodiment is now described with reference to FIG. 1 and a comparative example in FIG. 3. FIG. 3 is a cross-sectional view of a semiconductor apparatus according to a comparative example. It should be noted that the comparative example is different from the embodiment only in that the plurality of fins and the circumferential wall part are provided on the top plate. Therefore, the same numbers refer to parts having the same names as those of the embodiment, and repetitive description is omitted.

The cooler 2 according to the embodiment has the plurality of fins 22 on the upper surface of the bottom plate 21, as shown in FIG. 1. Also, the plurality of fins 22 and the circumferential wall part 23 surrounding the outer circumference of the plurality of fins 22 are provided on the upper surface of the bottom plate 21. The bottom plate 21, the plurality of fins 22 and the circumferential wall part 23 may be integrally formed.

Referring to FIG. 1, the bottom plate 21 and the circumferential wall part 23 form a box-shaped cooler case that is open upward. Also, the top plate 20 forms a lid part that closes the opening of the cooler case. The top plate 20 is bonded to the distal ends (upper ends) of the circumferential wall part 23 and the plurality of fins 22 described above by, for example, brazing. More specifically, the top plate 20 is bonded to the circumferential wall part 23 and the plurality of fins 22 with the bonding material B.

On the other hand, the cooler 2 according to the comparative example has the plurality of fins 22 on the lower surface of the top plate 20, as shown in FIG. 3. Also, the circumferential wall part 23 is provided on the lower surface of the top plate 20 so as to surround the outer circumference of the plurality of fins 22. The top plate 20, the plurality of fins 22 and the circumferential wall part 23 may be integrally formed.

Referring to FIG. 3, the top plate 20 and the circumferential wall part 23 form a box-shaped cooler case that is open downward. Also, the bottom plate 21 forms a lid part that closes the opening of the cooler case. The bottom plate 21 is bonded to the distal ends (lower ends) of the circumferential wall part 23 and the plurality of fins 22 described above by, for example, brazing. More specifically, the bottom plate 21 is bonded to the circumferential wall part 23 and the plurality of fins 22 with the bonding material B.

In the embodiment and the comparative example, the bonding material B is formed of, for example, a sheet-like brazing material. The bonding material B has a predetermined thickness and is disposed in a predetermined range of the bottom plate 21. The bonding material B is formed of an aluminum-alloy-based metallic material equivalent to that of the top plate 20 and the bottom plate 21. Also, the semiconductor elements 4 and the insulating substrates 3 to be cooled are disposed on the upper surface of the top plate 20. The thickness of the top plate 20 is set to be smaller than the thickness of the bottom plate 21 from viewpoint of the heat conductivity. Also, the semiconductor elements 4 are a heat source that generates heat when the apparatus is driven. For that, generally in the cooler 2, the temperature of the top plate 20 is more easily increased than those of the bottom plate 21 and the circumferential wall part 23, and corrosion on the top plate 20 side advances more easily than the corrosion on the bottom plate 21 side and the circumferential wall part 23 side.

In the comparative example, in the internal space of the cooler 2, the heat dissipation surface 20a side of the top plate 20 having a metallic base material exposed tends to corrode more easily than the bottom plate 21 side having the bonding material B thereon. As described above, since the top plate 20 is thinner than the bottom plate 21, the top plate 20 has holes with advance of corrosion, and there is a risk that a coolant leaks to outside.

On the other hand, according to the embodiment, in the internal space of the cooler 2, the bottom plate 21 side having a metallic base material exposed tends to corrode more easily than the top plate 20 side having the bonding material B thereon. Also, the advance on the corrosion of the top plate 20 side is suppressed. As described above, since the bottom plate 21 is thicker than the top plate 20, the risk that a hole is opened and a coolant leaks to outside through the hole can be suppressed even when the corrosion advances.

The bonding material B used in the embodiment and the comparative example is formed of a material having a higher electric potential than that of the base materials of the top plate 20 and the bottom plate 21. Accordingly, the inventors of the subject application have found a tendency of corrosion within a flow path for a coolant that a part having a lower electric potential more easily corrodes and a part having a higher electric potential suppresses advance of the corrosion. More specifically, by using the bonding material B having a higher electric potential than that of the metallic base material of the top plate 20 and the bottom plate 21, the corrosion on the side without the bonding material B advances more easily while advance of corrosion on the side having the bonding material B can be suppressed. Therefore, the inventors of the subject application have reached the present invention with focus on the tendency of corrosion depending on the height of the electric potential and the thicknesses of the top plate 20 and the bottom plate 21 in the coolant flow path in the inner part of the cooler 2.

In other words, the essence of the present invention is to provide a higher electric potential on the top plate 20 side having the heat dissipation surface 20a than on the bottom plate 21 side viewed from the coolant flow path. Specifically, according to the embodiment, the cooler 2 includes the top plate 20, one surface of which serves as the heat dissipation surface 20a, the bottom plate 21 disposed so as to face the top plate 20 and having a larger thickness than that of the top plate 20, the plurality of fins 22 provided on the bottom plate 21, and the circumferential wall part 23 provided so as to surround the outer circumference of the plurality of fins 22 along the outer circumferential edges of the bottom plate 21. The plurality of fins 22 and the circumferential wall part 23 are bonded to the heat dissipation surface 20a of the top plate 20, and a flow path for a coolant is formed by a space enclosed by the top plate 20, the bottom plate 21, the plurality of fins 22, and the circumferential wall part 23. Also, the top plate 20 side has a higher electric potential than an electric potential on the bottom plate 21 side in the flow path for the coolant.

According to this configuration, the plurality of fins 22 and the circumferential wall part 23 are provided on the bottom plate 21, and a cooler case is formed on the bottom plate 21 side. Also, in a space (flow path for a coolant) within the cooler 2, the top plate 20 side having a relatively small thickness has a higher electric potential than that of the bottom plate 21 side. Therefore, it is more difficult for the top plate 20 side to corrode than the bottom plate 21 side. In other words, it is intended that corrosion to some extent is allowed on the bottom plate 21 side having a relatively large thickness while the electric potential on the top plate 20 side having a smaller thickness than that of the bottom plate 21 is higher so that the corrosion does not advance easily as much as possible. Thus, local corrosion at a predetermined part of a coolant flow path can be suppressed, and the life of the cooler 2 can be extended.

Also, in the embodiment, the bonding material B having a higher electric potential than that of the bottom plate 21 is used for bonding the plurality of fins 22 and the circumferential wall part 23 to the top plate 20. According to this configuration, the bonding material B is interposed between the distal ends of the plurality of fins 22 and circumferential wall part 23 and the top plate 20. On the flow path for a coolant, the bonding material B is disposed on the top plate 20 side, the bonding material B is not disposed on the bottom plate 21 side, and the bottom plate 21 is exposed. Therefore, with the bonding material B, a potential difference can be caused between the top plate 20 side and the bottom plate 21 side.

It should be noted that the potential difference between the top plate 20 side and the bottom plate 21 side, that is, the potential difference between the bonding material B and the bottom plate 21 is preferably equal to or greater than 50 mV. In this case, corrosion on the top plate 20 side can be suppressed as much as possible.

Also, in the embodiment, the bonding material B covers all over the lower surface (heat dissipation surface) of the top plate 20. Originally, it is sufficient to dispose the bonding material B only at the bonding part. However, according to this embodiment, the entire heat dissipation surface 20a is covered with the bonding material B, so that a potential difference can be acquired between the top plate 20 side and the bottom plate 21 side, and, at the same time, the base material of the top plate 20 is not exposed within the flow path for a coolant. As a result, the bonding material B can prevent corrosion on the top plate 20. In other words, the bonding material B according to the present invention has not only the original function of bonding between members but also a function as a protective coat for preventing corrosion on the top plate 20.

Also, in the embodiment, the bonding material B is formed of a sheet-like brazing material. According to this configuration, the sheet-like bonding material B can be cut in advance in accordance with the size of the top plate 20, and the bonding material B disposed between the plurality of fins 22 and the circumferential wall part 23 and the top plate 20 can be inserted to a furnace. The bonding material B melts within the furnace, so that the plurality of fins 22 and the circumferential wall part 23 and the top plate 20 are bonded and that the entire lower surface (heat dissipation surface 20a) of the top plate 20 is covered with the brazing material. In this way, by using a sheet-like brazing material as the bonding material B, the process for manufacturing the cooler 2 (mainly, the bonding step and the protective coat forming step) can be simplified. It should be noted that the bonding material B is not limited to being sheet-like, but a paste-form brazing material may be applied to the entire lower surface of the top plate 20.

Also, according to the embodiment, the cooler 2 is preferably formed of an aluminum alloy mainly containing aluminum. For example, the base material of the top plate 20 and the bottom plate 21 is preferably formed of a 6000 series aluminum alloy such as A6063. The 6000 series aluminum alloy contains pure aluminum having a strength increased, by mainly adding magnesium and silicon thereto and has excellent strength and corrosion resistance. For example, the cooler 2 may mainly contain aluminum and contain silicon equal to or greater than 0.2% and equal to or less than 1.5%, magnesium equal to or greater than 0.35% and equal to or less than 1.5%, copper equal to or greater than 0% and equal to or less than 0.7%, and zinc equal to or greater than 0% and equal to or less than 0.7%. More specifically, the composition of the base material of the top plate 20 and the bottom plate 21 preferably contains at least copper equal to or less than 2.0%. More preferably, it contains copper equal to or less than 0.2%. It should be noted that the composition ratio is represented by a percent by weight. The expression "mainly contain" refers to a composition ratio equal to or greater than 80%.

The top plate 20 and the bottom plate 21 are preferably formed of an aluminum alloy of the same composition. Alternatively, the top plate 20 and the bottom plate 21 may be formed of materials having different compositions from each other without limiting to an aluminum alloy of the same composition. In this case, the composition ratio is preferably adjusted such that the bottom plate 21 and the top plate 20 have an equal electric potential or that the top plate 20 has a higher electric potential than that of the bottom plate 21.

The brazing material as the bonding material B is preferably formed of a 4000 series aluminum alloy such as A4047. The 4000 series aluminum alloy mainly contains aluminum to which silicon is mainly added, and it has excellent heat resistance and wear resistance. It should be noted that the materials of the constituent members of the cooler 2 are not limited to an aluminum alloy but may be, for example, a copper alloy. For example, the cooler 2 may mainly contain aluminum and contain silicon equal to or greater than 4.5% and equal to or less than 13.5%, magnesium equal to or greater than 0% and equal to or less than 1.3%, copper equal to or greater than 0% and equal to or less than 1.3%, and zinc equal to or greater than 0% and equal to or less than 0.25%. In the composition of the bonding material B, the composition ratio of the silicon is greater than that of the base material of the top plate 20 and the bottom plate 21. Also, the composition ratio of magnesium which has an effect of reducing an electric potential is low. Furthermore, the composition ratio of copper having an effect of increasing an electric potential may be high. Also, the composition ratio of manganese having an effect of reducing an electric potential may be low. More specifically, the composition of the bonding material B contains at least silicon equal to or greater than 7.5% and zinc equal to or less than 0.25%. It should be noted that the composition ratio is represented by a percent by weight. The expression "mainly contain" refers to a composition ratio equal to or greater than 80%.

Also, according to the embodiment, each of the semiconductor elements 4 is disposed on the upper surface (the other surface) of the top plate 20 through the insulating substrate 3. The plurality of fins 22 are disposed immediately under the semiconductor elements 4. In this way, according to the embodiment, the semiconductor elements 4 and the insulating substrates 3 are to be cooled by the cooler 2. This is because the semiconductor elements 4 are a heat source that generates heat when the apparatus is driven.

In the semiconductor apparatus 1, the thickness of the top plate 20 is as small as possible in order to improve its heat conductivity. More specifically, the thickness of the top plate 20 is preferably equal to or greater than 250 and equal to or less than 5.0 mm. By setting the thickness of the top plate 20 in this range, heat of the semiconductor elements 4 can be effectively discharged from the heat dissipation surface without losing heat conductivity.

On the other hand, the bottom plate 21 requires rigidity to some extent because the bottom plate 21 side is fixed to an installation destination. For that, the bottom plate 21 is formed to be thicker than the top plate 20, and its rigidity is acquired. More specifically, the thickness of the bottom plate 21 is preferably equal to or greater than 2.0 mm and equal to or less than 10.0 mm.

In addition to the aforementioned thicknesses of the top plate 20 and bottom plate 21, the thickness of the bonding material B is preferably equal to or greater than 50 µm and equal to or less than 500 µm. By setting the thickness of the bonding material B in this range, the function as a protective coat that protects the heat dissipation surface of the top plate 20 can also be achieved without losing the heat conductivity.

Figure 4:
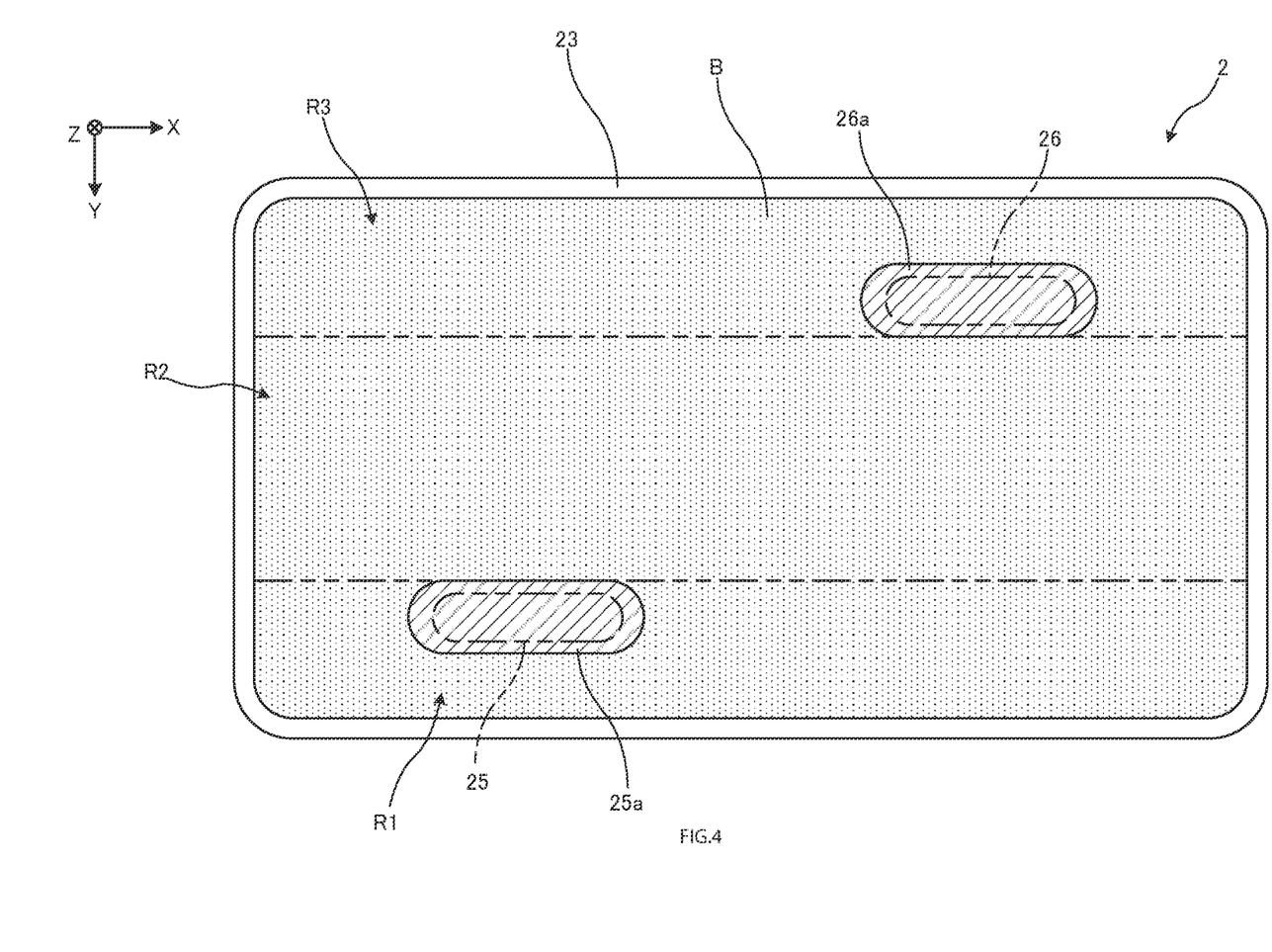
FIG. 4 is a plan view of a cooler according to a variation example from which a bottom plate thereof is removed and which is viewed from its lower side.

Having described the case where the bonding material B having a uniform thickness is disposed on the lower surface of the top plate 20 according to the embodiment above, the present invention is not limited to the configuration. The bonding material B may be formed to be partially thicker. FIG. 4 is a plan view of a cooler according to a variation example from which the bottom plate thereof is removed and which is viewed from its lower side. More specifically, according to the embodiment, as shown in FIGS. 2 and 4, the bottom plate 21 has the inlet portion 25 and the discharge portion 26 for a coolant. The inlet portion 25 and the discharge portion 26 are disposed so as to diagonally face each other with the plurality of fins 22 interposed therebetween in planar view. In this case, the thickness of the bonding material B in areas 25a and 26a of the top plate 20 facing the inlet portion 25 and/or the discharge portion 26 in the Z direction is preferably larger than that of its surrounding area. According to this configuration, the flow velocity of a coolant is high in the vicinity of the inlet portion 25 and the discharge portion 26 for the coolant. Thus, as a flow path for the coolant, it can be said that the top plate 20 facing the inlet portion 25 and the discharge portion 26 is an environment that easily corrodes. Therefore, by having a larger thickness of the bonding material B facing the inlet portion 25 and the discharge portion 26 than the thickness of its surrounding area, corrosion on the top plate 20 can be effectively prevented. It should be noted that the adjustment of the thickness of the bonding material B may be performed on parts corresponding to both of the inlet portion 25 and the discharge portion 26 or only a part corresponding to one of the inlet portion 25 and the discharge portion 26.

According to the embodiment, as described above, by providing a potential difference between the top plate 20 side and the bottom plate 21 side in the cooler 2, corrosion on the top plate 20 side having a relatively small thickness is suppressed as much as possible. However, the present invention does not completely prevent corrosion by a coolant of an inner wall surface of the cooler 2. According to this embodiment, as described above, because of the position of a cooling target (such as the semiconductor elements 4) in the cooler 2, the thicknesses of the top plate 20 and the bottom plate 21 are different in consideration of the cooling efficiency (heat conductivity) and rigidity. Thus, by having a higher electric potential on the top plate 20 side having a relatively small thickness than the electric potential on the bottom plate 21 side, suppression of the corrosion on the top plate 20 side is attempted as much as possible. This means that a corrosion hole through which a coolant leaks is not formed in the bottom plate 21 although corrosion to some extent is allowed on the bottom plate 21 side having a relatively large thickness.

Figure 5:
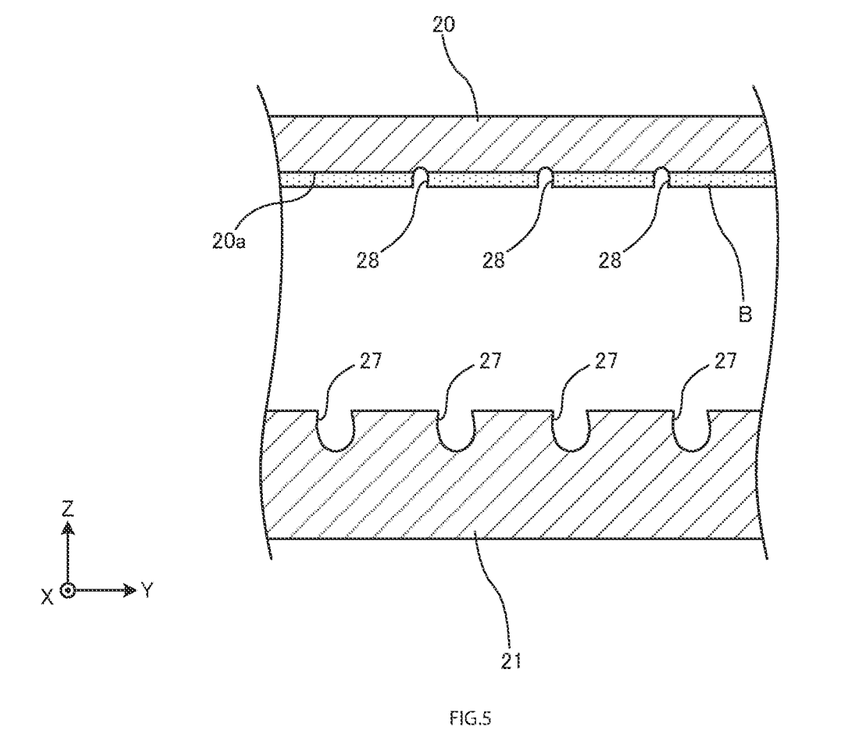
FIG. 5 is a partially enlarged view of FIG. 1.

An example of a case where corrosion occurs in the cooler 2 according to the embodiment is now described with reference to FIG. 5. FIG. 5 is a partially enlarged view of FIG. 1. It should be noted that the corrosion shown in FIG. 5 is merely an example and is not limited thereto. For example, FIG. 5 shows a case where relatively small corrosion holes are slightly formed also on the top plate 20 side.

As shown in FIG. 5, the upper surface of the bottom plate 21 has a plurality of corrosion holes 27 (first corrosion holes) having a predetermined size. The depths of the corrosion holes 27 are, for example, equal to or greater than 400 µm and equal to or less than 1100 µm. On the other hand, the heat dissipation surface 20a of the top plate 20 has a plurality of corrosion holes 28 (second corrosion holes) having a predetermined size. The corrosion holes 28 are partially formed also on the lower surface (heat dissipation surface 20a) of the top plate 20 through the bonding material B. The depths of the corrosion holes 28 are shallower than the corrosion holes 27 and are, for example, equal to or greater than 100 µm and equal to or less than 550 µm. More specifically, the corrosion holes 28 have a depth about half of the depth of the corrosion holes 27. Also, the number of the corrosion holes 28 is smaller than the number of the corrosion holes 27.

In this way, according to the embodiment, by having a higher electric potential on the top plate 20 side having a relatively small thickness, the top plate 20 side does not easily corrode compared with the bottom plate 21 side. Conversely, the bottom plate 21 side having a relatively large thickness corrodes more easily than the top plate 20 side. For that reason, the corrosion holes 27 on the bottom plate 21 side are formed to be relatively larger than the corrosion holes 28 on the top plate 20 side, and the number of the corrosion holes 27 is higher. As described above, essentially, because the bottom plate 21 has a thickness enough to acquire rigidity, corrosion to some degree thereof can be allowed. Therefore, a situation that causes liquid leakage through the corrosion holes 27 on the bottom plate 21 side does not occur.

On the other hand, although the top plate 20 side easily has a higher temperature than that on the bottom plate 21 side because the top plate 20 has the semiconductor elements 4 on its upper surface, the top plate 20 side does not easily corrode in the first place because the top plate 20 side has a higher electric potential than that of the bottom plate 21 side. Because the bonding material B that is formed of a brazing material corrodes first if corrosion occurs, the size of the corrosion holes 28 themselves is sufficiently smaller than the size of the corrosion holes 27 on the bottom plate 21 side if the corrosion advances to the base material of the top plate 20. Therefore, a situation where liquid leaks through the corrosion holes 28 does not occur also on the top plate 20 side.

Figure 6:
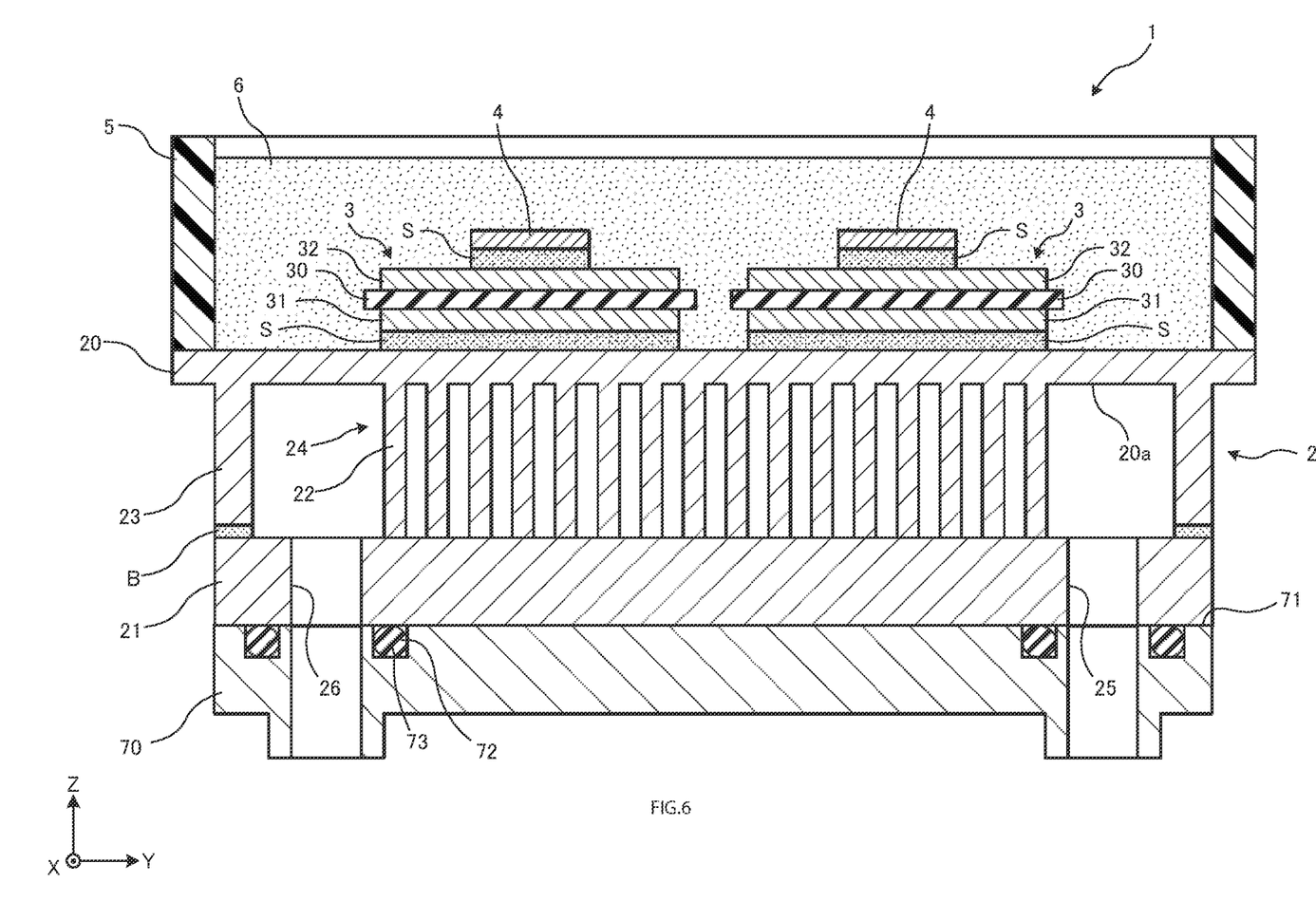
FIG. 6 is a cross-sectional view of a semiconductor apparatus according to a variation example.
Figure 7:
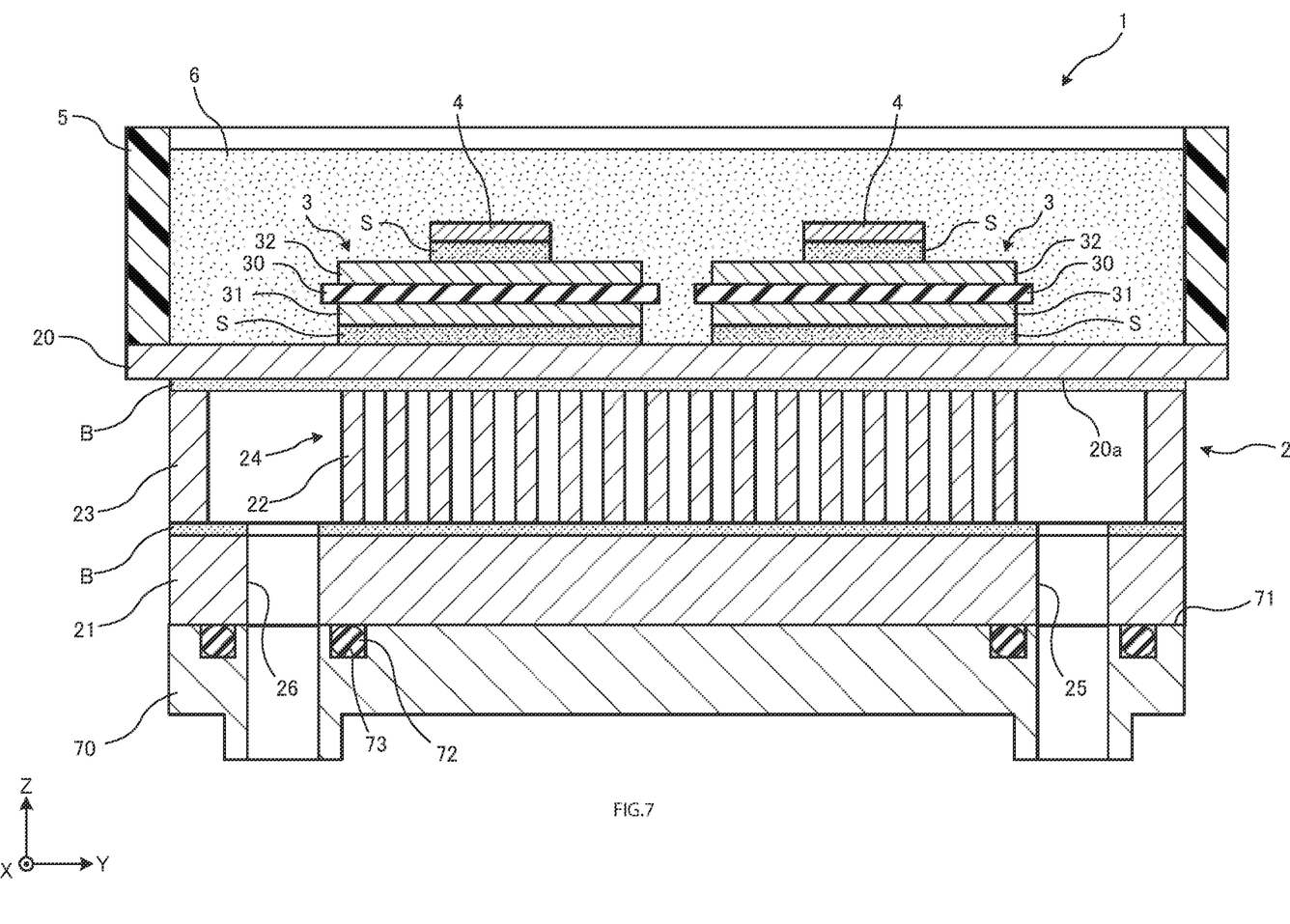
FIG. 7 is a cross-sectional view of a semiconductor apparatus according to another variation example.

Next, variation examples are described with reference to FIGS. 3, 6 and 7. FIG. 6 is a cross-sectional view of a semiconductor apparatus according to a variation example. FIG. 7 is a cross-sectional view of a semiconductor apparatus according to another variation example.

As described above, in the comparative example shown in FIG. 3, the bonding material B is disposed on the bottom plate 21 side, and the top plate 20 side has a lower electric potential than that on the bottom plate 21 side. On the other hand, by keeping the same layout as that in FIG. 3, the composition of the bonding material B may be adjusted such that the electric potential on the top plate 20 side is higher than the electric potential on the bottom plate 21 side. In other words, referring to FIG. 3, the bonding material B on the bottom plate 21 side may have a lower electric potential than that on the top plate 20. In this case, because the bonding material B has a lower electric potential, the bonding material B serves as a sacrifice layer, and corrosion advances earlier than the top plate 20. The corrosion on the top plate 20 side can be delayed by the time until the bonding material B corrodes and disappears, and liquid leakage on the top plate 20 side can be suppressed. However, in this case, because the bonding material B is required to be thick enough, there is a problem such as peeling prevention at the bonding part between the top plate 20 and the bottom plate 21. Therefore, as shown in FIG. 1, the bonding material B preferably has a higher electrical potential.

Also, as shown in FIG. 6, a configuration is possible in which both of the lower surface (heat dissipation surface 20a) of the top plate 20 and the upper surface of the bottom plate 21 are not covered with the bonding material B although the top plate 20 and the bottom plate 21 are bonded with the bonding material B. In this case, the bonding material B may have a square frame shape following the shape of the circumferential wall part 23. Also in this case, the top plate 20 side preferably has a higher electric potential than that of the bottom plate 21 side. Also in this configuration, because the bottom plate 21 side is corroded earlier than the top plate 20 side, the corrosion on the top plate 20 side can be delayed to suppress liquid leakage on the top plate 20 side. However, in this case, because the top plate 20 and the bottom plate 21 have lower machining, rigidity and heat dissipation properties, providing the bonding material B having a higher electric potential is more preferable as shown in FIG. 1.

Furthermore, as shown in FIG. 7, both of the lower surface (heat dissipation surface 20a) of the top plate 20 and the upper surface of the bottom plate 21 may be covered with the bonding material B. In this case, the top plate 20 side preferably has a higher electric potential than that on the bottom plate 21 side. Also in this configuration, because the bottom plate 21 side is corroded earlier than the top plate 20 side, the corrosion on the top plate 20 side can be delayed to suppress liquid leakage on the top plate 20 side. However, in this case, because the bonding material B is required to be thick enough, there is a problem such as peeling prevention at the bonding part between the top plate 20 and the bottom plate 21. Therefore, as shown in FIG. 1, the bonding material B on the top plate 20 side having a higher electrical potential is preferable.

As described above, according to the embodiment, by providing a potential difference between the top plate 20 and the bottom plate 21 in the cooler 2, local corrosion on the top plate 20 side can be suppressed.

Having described the case where, according to the aforementioned embodiment, the inlet portion 25 and the discharge portion 26 face each other diagonally, the invention is not limited to the configuration. For example, the inlet portion 25 and the discharge portion 26 may face each other in the direction (Y direction) orthogonal to the longitudinal direction of the cooler 2.

Also, having described the case where, according to the aforementioned embodiment, each of the inlet portion 25 and the discharge portion 26 has a long-hole shape that is long in the longitudinal direction (X direction), the invention is not limited to the configuration. The shapes, positions and so on of the inlet portion 25 and the discharge portion 26 can be changed as required.

Also, according to the aforementioned embodiment, the number and positions of the semiconductor elements 4 are not limited to the configuration described above and can be changed as required.

Also, according to the aforementioned embodiment, the number and layout of the circuit plates 32 are not limited to the configuration described above and can be changed as required.

Also, having described that, according to the aforementioned embodiment, the insulating substrate 3 and the semiconductor element 4 have a rectangular or square shape in planar view, the invention is not limited to the configuration. These components may be formed in a polygonal shape excluding those described above.

Also, having described the embodiment and the variation examples, all or a part of each of the embodiment and the variation examples may be combined.

Also, the embodiment is not limited to the aforementioned embodiment and variation examples, and various changes, replacements and variations can be made thereto without departing from the spirit and scope of the technical idea. Furthermore, if the technical idea can be realized by a different method with an advance of the technology or a different technology derived therefrom, the technical idea can be implemented by using the method. Therefore, the claims cover all embodiments that can be included within the scope of the technical idea.

Characteristic points according to the aforementioned embodiment are organized below.

A cooler according to the aforementioned embodiment includes a top plate, one surface of which serves as a heat dissipation surface, a bottom plate disposed so as to face the top plate and having a larger thickness than that of the top plate, a plurality of fins provided on the bottom plate, and a circumferential wall part provided so as to surround an outer circumference of the plurality of fins along outer circumferential edges of the bottom plate. The plurality of fins and the outer circumferential wall part are bonded to the heat dissipation surface of the top plate, and a flow path for a coolant is formed by a space enclosed by the top plate, the bottom plate, the plurality of fins, and the circumferential wall part, and a side of the top plate (top plate side) has a higher electric potential than an electric potential of a side of the bottom plate (bottom plate side).

Also, the cooler according to the aforementioned embodiment further includes a bonding material that bonds the plurality of fins and the circumferential wall part to the top plate. The bonding material has a higher electric potential than that on the bottom plate side.

Also, in the cooler according to the aforementioned embodiment, the bonding material covers all over the heat dissipation surface on the flow path for the coolant.

Also, in the cooler according to the aforementioned embodiment, the bonding material is formed of a sheet-like brazing material.

Also, in the cooler according to the aforementioned embodiment, a potential difference between the bottom plate side and the bonding material is equal to or greater than 50 mV.

Also, in the cooler according to the aforementioned embodiment, the bottom plate has a base material exposed to the flow path for the coolant.

Also, in the cooler according to the aforementioned embodiment, the bonding material and the base material of the bottom plate mainly contain aluminum, and the bonding material contains a higher percentage of silicon and a lower percentage of magnesium than those of the base material of the bottom plate.

Also, in the cooler according to the aforementioned embodiment, the bonding material has a composition mainly containing aluminum and at least containing silicon equal to or greater than 7.5% and zinc equal to or less than 0.25%.

Also, in the cooler according to the aforementioned embodiment, the base material of the bottom plate has a composition mainly containing aluminum and at least containing copper equal to or less than 2.0%.

Also, in the cooler according to the aforementioned embodiment, an upper surface of the bottom plate has a first corrosion hole.

Also, in the cooler according to the aforementioned embodiment, the heat dissipation surface of the top plate has a second corrosion hole extending through the bonding material, and the second corrosion hole is smaller than the first corrosion hole.

Also, in the cooler according to the aforementioned embodiment, the bonding material has a thickness equal to or greater than 50 µm and equal to or less than 500 µm.

Also, in the cooler according to the aforementioned embodiment, the top plate has a thickness equal to or greater than 0.25 mm and equal to or less than 5.0 mm.

Also, in the cooler according to the aforementioned embodiment, the bottom plate has a thickness equal to or greater than 2.0 mm and equal to or less than 10.0 mm.

Also, in the cooler according to the aforementioned embodiment, a base material of the top plate and the base material of the bottom plate are formed of materials having different compositions, and the base material of the top plate has a higher electric potential than the electric potential of the base material of the bottom plate.

Also, a semiconductor apparatus according to the aforementioned embodiment includes the aforementioned cooler, and a semiconductor element disposed on another surface of the top plate through an insulating substrate. The plurality of fins are disposed immediately under the semiconductor element.

Also, in the semiconductor apparatus according to the aforementioned embodiment, the bottom plate has an inlet portion and a discharge portion for a coolant, the inlet portion and the discharge portion are disposed so as to face each other with the plurality of fins interposed therebetween, and the bonding material facing the inlet portion and/or the discharge portion has a thickness larger than its surrounding area.

As described above, the present invention has an effect that local corrosion at a predetermined part of a coolant path can be suppressed and is particularly advantageous for a water-cooled cooler and a semiconductor apparatus including it.

REFERENCE SIGNS LIST 1 semiconductor apparatus
2 cooler
3 insulating substrate
4 semiconductor element
5 case member
6 sealing resin
20 top plate
21 bottom plate
22 fin
23 circumferential wall part
24 fin collection
25 inlet portion
26 discharge portion
27 corrosion hole (first corrosion hole)
28 corrosion hole (second corrosion hole)
30 insulating plate
31 heat dissipation plate
32 circuit plate
70 flange
71 attachment surface
72 O-ring
73 groove
S solder
B bonding material
R1 first header part
R2 fin accommodating part
R3 second header part

What is claimed is:
1. A cooler, comprising:
a top plate, one surface of which serves as a heat dissipation surface;
a bottom plate disposed so as to face the top plate and having a thickness greater than a thickness of the top plate;
a plurality of fins provided between the top plate and the bottom plate;
a circumferential wall part provided between the top plate and the bottom plate so as to surround an outer circumference of the plurality of fins along outer circumferential edges of the bottom plate; and
a bonding material that bonds the plurality of fins and the circumferential wall part to the top plate, wherein
the plurality of fins and the outer circumferential wall part are bonded to the heat dissipation surface of the top plate, and a flow path for a coolant is formed by a space enclosed by the top plate, the bottom plate, the plurality of fins and the circumferential wall part,
the top plate has an electric potential higher than an electric potential of the bottom plate,
the bonding material is made of a material containing mainly aluminum that is equal to or greater than 80%, by mass %, and further contains Si and Zn in the ranges $0.25\% \leq Si \leq 7.5\%$ and $0 \leq Zn \leq 0.25\%$, and
the bottom plate made of a material mainly containing aluminum, and further contains:
Si and Mg in the ranges $0.2\% \leq Si \leq 1.5\%$ and $0.35\% \leq Mg \leq 1.5\%$, Si,
Mg, Cu and Zn in the ranges $0.2\% \leq Si \leq 1.5\%$, $0.35\% \leq Mg \leq 1.5\%$, $0 \leq Cu \leq 0.7\%$, and $0 \leq Zn \leq 0.7\%$, or
Si, Mg, Cu and Zn in the ranges $4.5\% \leq Si \leq 13.5\%$, $0 \leq Mg \leq 1.3\%$, $0 \leq Cu \leq 1.3\%$ and $0 \leq Zn \leq 0.25\%$.

2. The cooler according to claim 1, wherein the bonding material has an electric potential higher than the electric potential of the bottom plate.

3. The cooler according to claim 1, wherein the bonding material covers all over the heat dissipation surface of the top plate.

4. The cooler according to claim 1, wherein the bonding material is a sheet-like brazing material.

5. The cooler according to claim 1, wherein a potential difference between the bottom plate and the bonding material is equal to or greater than 50 mV.

6. The cooler according to claim 1, wherein the bottom plate has a base material exposed to the flow path for the coolant.

7. The cooler according to claim 1, wherein
the bonding material and a base material of the bottom plate each contain mainly aluminum, and
the bonding material contains a percentage of silicon higher than a percentage of silicon of the base material of the bottom plate, and a percentage of magnesium lower than a percentage of magnesium of the base material of the bottom plate.

8. The cooler according to claim 1, wherein a base material of the bottom plate has a composition mainly containing aluminum and at least containing copper equal to or less than 2.0%.

9. The cooler according to claim 1, wherein an upper surface of the bottom plate has a first corrosion hole.

10. The cooler according to claim 9, wherein
the heat dissipation surface of the top plate has a second corrosion hole extending through the bonding material, and
the second corrosion hole has a diameter smaller than a diameter of the first corrosion hole.

11. The cooler according to claim 1, wherein the bonding material has a thickness in a range of 50 μm to 500 μm.

12. The cooler according to claim 1, wherein the top plate has a thickness in a range of 0.25 mm to 5.0 mm.

13. The cooler according to claim 1, wherein the bottom plate has a thickness in a range of 2.0 mm to 10.0 mm.

14. The cooler according to claim 1, wherein a base material of the top plate and a base material of the bottom plate are made of materials having different compositions, and the base material of the top plate has an electric potential higher than an electric potential of the base material of the bottom plate.

15. A semiconductor apparatus, comprising:
the cooler according to claim 1;
an insulating substrate disposed on an other surface of the top plate; and
a semiconductor element disposed on the other surface of the top plate through the insulating substrate, wherein
the plurality of fins are disposed immediately under the semiconductor element.

16. The semiconductor apparatus according to claim 15, wherein
the bottom plate has an inlet portion and a discharge portion for the coolant,
the inlet portion and the discharge portion are disposed so as to face each other with the plurality of fins interposed therebetween, and
the bonding material facing the inlet portion and/or the discharge portion has a thickness larger than its surrounding area.

* * * * *